United States Patent
Shibata et al.

(10) Patent No.: US 7,067,847 B2
(45) Date of Patent: Jun. 27, 2006

(54) SEMICONDUCTOR ELEMENT

(75) Inventors: Tomohiko Shibata, Kasugai (JP); Keiichiro Asai, Nagoya (JP); Yukinori Nakamura, Nagoya (JP); Mitsuhiro Tanaka, Handa (JP)

(73) Assignee: NGK Isulators, Ltd., Nagoya (JP)

( * ) Notice: Subject to any disclaimer, the term of this patent is extended or adjusted under 35 U.S.C. 154(b) by 11 days.

(21) Appl. No.: 10/017,325

(22) Filed: Dec. 14, 2001

(65) Prior Publication Data

US 2002/0125491 A1  Sep. 12, 2002

(30) Foreign Application Priority Data

Dec. 21, 2000  (JP) .............................. 2000-388304
Sep. 4, 2001  (JP) .............................. 2001-266928

(51) Int. Cl.
*H01L 33/00* (2006.01)

(52) U.S. Cl. .......................... 257/94; 257/80; 257/199; 257/77; 257/96; 257/194; 257/97; 438/22

(58) Field of Classification Search ................. 257/79, 257/80, 94, 199, 77, 96, 194, 97; 438/22
See application file for complete search history.

(56) References Cited

U.S. PATENT DOCUMENTS

| | | | | |
|---|---|---|---|---|
| 5,990,495 A | * | 11/1999 | Ohba .......................... | 257/94 |
| 5,990,496 A | * | 11/1999 | Kunisato et al. .............. | 257/94 |
| 6,162,656 A | * | 12/2000 | Kunisato et al. .............. | 438/46 |
| 6,232,623 B1 | * | 5/2001 | Morita ........................ | 257/103 |
| 6,265,287 B1 | * | 7/2001 | Tsujimura et al. .......... | 438/478 |
| 6,455,877 B1 | * | 9/2002 | Ogawa et al. ................. | 257/99 |
| 6,593,016 B1 | * | 7/2003 | Chiyo et al. ................. | 428/698 |
| 6,677,708 B1 | * | 1/2004 | Hori et al. ................... | 313/498 |

* cited by examiner

*Primary Examiner*—Eddie Lee
*Assistant Examiner*—Junghwha Im
(74) *Attorney, Agent, or Firm*—Burr & Brown

(57) ABSTRACT

On a substrate made of e.g., sapphire single crystal is formed an Al underlayer having FWHM X-ray rocking curve value of 90 seconds or below. A buffer layer is formed on the AlN underlayer and has a composition of $Al_pGa_qIn_{1-p-q}N$ ($0 \leq p \leq 1$, $0 \leq y \leq q$). A GaN-based semiconductor layer group is formed on the buffer layer.

13 Claims, 1 Drawing Sheet

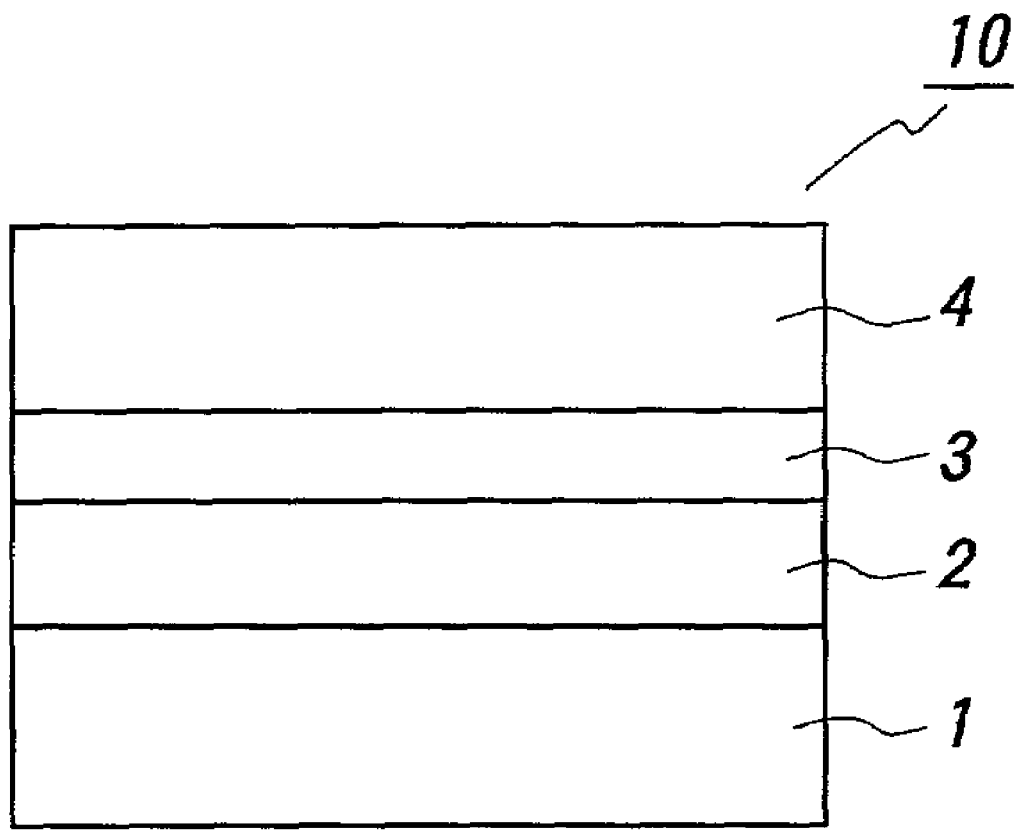

SEMICONDUCTOR ELEMENT

BACKGROUND OF THE INVENTION

1. Field of the Invention

This invention relates to a semiconductor element, particularly usable for a semiconductor light-emitting element such as a light-emitting diode.

2. Related Art Statement

Recently, much attention is paid to a GaN-based compound semiconductor (hereinafter, often called as a "GaN-based semiconductor") as a semiconductor constituting a light-emitting layer of a blue light-emitting device. Such a GaN-based semiconductor is formed by a MOCVD method using a trimethylgallium as a Ga raw material gas and an ammonia gas as a $N_2$ raw material gas on a substrate consisting of different materials such as sapphire.

However, if a light-emitting layer is made of such a GaN-based semiconductor, the crystal quality and the surface morphology of the light-emitting layer is deteriorated, so that a blue light can not be effectively generated and emitted from the layer.

In order to work out the problem, such an attempt is made in the Japanese Laid-open Publication Kokai Hei 4-297023 (JP A 4-297023) as forming a buffer layer made of a semiconductor nitride of $Ga_aAl_{1-a}N$ ($0<a\leq 1$), and thus, improving the crystallinity and the surface morphology of the light-emitting layer.

Particularly, however, the crystallinity can not be sufficiently improved by such a buffer layer, and thus, the luminous efficiency of a semiconductor light-emitting element can not be improved.

SUMMARY OF THE INVENTION

It is an object of the present invention to provide a semiconductor element having a high crystallinity GaN-based semiconductor layer group usable as a semiconductor light-emitting element or the like.

In order to achieve the above object, this invention relates to a semiconductor element, including a substrate, an underlayer, on the substrate, made of a first semiconductor nitride including at least Al element, the crystallinity of the underlayer being set to 90 seconds or below in full width at half maximum of (FWHM) X-ray rocking curve, a buffer layer, on the underlayer, made of a second semiconductor nitride, and a semiconductor layer group, on the buffer layer, made of a third semiconductor nitride including at least Ga element. In this case, the Al content of the third semiconductor nitride is set smaller than that of the first semiconductor nitride.

The inventors had intensely studied for achieving the above object. As a result, they found out that in a semiconductor element including a given substrate and a GaN-based semiconductor layer group on the substrate, if a buffer layer is formed between the substrate and the semiconductor layer group, as in the above-discussed Japanese Laid-open Publication, and in addition, an underlayer satisfying the above requirements according to the present invention is formed between the buffer layer and the substrate, the object of the present invention can be achieved.

Generally, a buffer layer is formed in low crystallinity at a lower temperature within 500–700° C., in order to mitigate the difference in lattice constant between a substrate and a semiconductor layer group to be formed on the substrate. Therefore, the crystallinity of the semiconductor layer group can be improved to some degree due to the buffering effect from the buffer layer. Because of the low crystallinity of the buffer layer, however, the crystallinity of the semiconductor layer group can not be sufficiently improved.

On the contrary, in a semiconductor element according to the present invention, the high crystallinity underlayer is formed between the buffer layer and the substrate. Therefore, because of the high crystallinity of the underlayer, the crystallinity of the semiconductor layer group can be sufficiently improved, even while being positioned on the low crystallinity buffer layer.

As a result, a semiconductor element having a GaN-based semiconductor layer group of satisfactory crystallinity and surface morphology, usable as a blue light-emitting element and so on, can be provided.

Herein, the FWHM in X-ray rocking curve of the first semiconductor nitride constituting the underlayer is measured at (002) reflection. Also, the wording "semiconductor layer group" means a "single semiconductor layer" or a "multilayered structure made of plural semiconductor layers" as occasion demands.

BRIEF DESCRIPTION OF THE DRAWINGS

For better understanding of the present invention, reference is made to the attached drawings, wherein:

FIG. 1 is a cross sectional view showing a semiconductor light-emitting element according to the present invention.

DETAILED DESCRIPTION OF THE INVENTION

This invention will be described in detail, hereinafter. FIG. 1 is a cross sectional view showing a semiconductor light-emitting element according to the present invention. A semiconductor light-emitting element 10 depicted in FIG. 1 includes a substrate 1, an underlayer 2 made of a first semiconductor nitride on the substrate 1, a buffer layer 3 made of a second semiconductor nitride on the underlayer 2, and a semiconductor layer group 4 made of a third semiconductor nitride on the buffer layer 3. As mentioned above, the semiconductor layer group 4 is composed of a single semiconductor layer or a multilayered structure made of plural semiconductor layers, depending on the intended use of the semiconductor light-emitting element 10.

It is required according to the present invention that the first semiconductor nitride constituting the underlayer 2 includes Al element. Generally, the composition of the first semiconductor nitride can be represented as $Al_xGa_yIn_{1-x-y}N$ ($0<x\leq 1$, $0\leq y<1$). Also, the first semiconductor nitride may include an additive element such as Ge, Si, Mg, Zn, Be, P or B as occasion demands. Moreover, the first semiconductor nitride may include a minute impurity contained in the raw material gases or the reactor or contained dependent on the forming condition. It is desired that the first semiconductor nitride includes at least 50 atomic percentages or more of Al for all of the III elements, particularly 100 atomic percentages of Al as a III element, that is, being made of AlN.

Then, it is required that the underlayer 2 has a high crystallity of 90 seconds or below, preferably 50 seconds or below in FWHM of X-ray rocking curve. By controlling the forming conditions, the crystallinity of the underlayer 2 can be developed to about 30 seconds in FWHM of X-ray rocking curve.

The underlayer 2 made of the first semiconductor nitride can be formed on the substrate 1 by a MOCVD method using a trimethylaluminum (TMA) or a triethylaluminum (TME) as an Al raw material gas and an ammonia ($NH_3$) as a $N_2$ raw material gas. If the underlayer 2 is formed thick, a HVPE method where a metallic aluminum or a metallic gallium is transported with a hydrogen chloride-based gas may be employed.

It is desired that the formation temperature of the underlayer is set to 1100° C. or over, particularly within 1100–1250° C. In this case, the high crystallinity underlayer can be easily formed. Here, the formation temperature is defined as the substrate temperature.

The formation temperature is much higher than that of the buffer layer, which is usually set to within 500–700° C.

If Ga element or In element is incorporated in the underlayer 2, a trimethylgallium (TMG) or a trimethylindium (TMI) is supplied as a Ga raw material gas or an In raw material gas onto the substrate 1 with the TMA and the $NH_3$ by a given flow rate ratio.

The thickness of the underlayer 2 is determined appropriately, depending on the thickness and the formation conditions of the semiconductor layer group 4 and the buffer layer 3. Preferably, the thickness of the underlayer 2 is set to 0.01 µm or over, particularly within 0.5–1000 µm, and more particularly within 0.8–5 µm. In this case, the crystallinity of the semiconductor layer group 4 can be easily developed.

In the view of the facilitation of heat emission from the semiconductor 10 and the enhancement of the crystallinity of the semiconductor layer group 4 originated from the enhancement of the crystallinity of the underlayer 2, it is desired as the thickness of the underlayer 2 is increased. On the other hand, in the view of the manufacturing cost, it is desired as the thickness of the underlayer 2 is decreased. Moreover, if the underlayer 2 is formed too thick, some cracks may be created and the underlayer 2 may be broken away from on the substrate 1. Therefore, particularly, if the underlayer 2 is formed within the above-mentioned temperature range, the thickness of the underlayer 2 is set within the above-mentioned thickness range.

The substrate 1 may be made of oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III-V single crystal such as GaAs single crystal, AlN single crystal, GaN single crystal or AlGaN single crystal, and boride single crystal such as $ZrB_2$.

Particularly, in the case of making the substrate 1 of the sapphire single crystal, it is desired that surface-nitriding treatment is performed on the main surface for the underlayer 2 or the like to be formed. The surface-nitriding treatment is performed as follows. First of all, the sapphire single crystal substrate is set in a nitrogen-including atmosphere such as an ammonia atmosphere, and then, heated for a given period. The thickness of the resulting surface nitride layer can be adjusted by controlling the nitrogen concentration, the nitriding temperature and the nitriding period appropriately.

If the sapphire single crystal substrate having the surface nitride layer thereon is employed, the crystallinity of the underlayer 2 formed directly on the main surface can be more enhanced. Moreover, the underlayer 2 can be easily formed thick, for example, up to 5 µm within the above-mentioned preferable thickness range, without cracks and breakaway not by using a specific condition.

Therefore, the crystallinity of the underlayer 2 can be more enhanced up to 50 seconds or below, particularly 30 seconds or below in FWHM of X-ray rocking curve, originated from the increase in thickness of the underlayer 2. Moreover, the crystallinity of the semiconductor layer group 4 as a main part of the semiconductor element 10 can be enhanced due to the high crystallinity of the underlayer 2.

Also, in the case of employing the sapphire single crystal substrate having the surface nitride layer, even though the underlayer 2 is formed at 1200° C. or below, particularly at 1150° C. within the above-mentioned preferable temperature range, the cystallinity of the underlayer 2 can be easily enhanced.

It is desired that the surface nitride layer is formed thinner, for example, in a thickness of 1 nm or below. Moreover, it is desired that the surface nitride layer is formed thicker, for example, so that the nitrogen content of the sapphire single crystal substrate at the depth of 1 nm from the main surface is set to two atomic percentages or over, in ESCA analysis.

The second semiconductor nitride constituting the buffer layer 3 may have a composition of $Al_pGa_qIn_{1-p-q}N$ ($0 \leq p \leq 1, 0 \leq y \leq q$), and may include an additive element and a minute impurity as mentioned above.

It is required that the Al content of the third semiconductor nitride constituting the semiconductor layer group 4 is set smaller than that of the first semiconductor nitride constituting the underlayer 2. In this case, a given compressive stress is exerted on the semiconductor layer group 4 from the underlayer 2, and thus, cracks formation in the semiconductor layer group 4 is suppressed.

Herein, since the thickness of the buffer layer 3 is thinner than those of the underlayer 2 and the semiconductor layer group 4, a stress that is exerted on the buffer layer 3 is minimized. Therefore, the material composition of the second semiconductor nitride constituting the buffer layer 3 can be appropriately determined, independent of the first semiconductor nitride and the third semiconductor nitride constituting the underlayer 2 and semiconductor layer group 4, respectively, only if the buffer layer 3 can exhibit the buffer effect.

From the same reason as the underlayer 2, it is desired that the thickness of the buffer layer 3 is set within 0.002–0.5 µm, particularly within 0.005–0.1 µm.

In the case of making the underlayer 2 of an Al-rich semiconductor nitride as the first semiconductor nitride, e.g., AlN and making the semiconductor layer group of a Ga-rich semiconductor nitride as the third semiconductor nitride, e.g., GaN, the difference in thickness between the underlayer 2 and the semiconductor layer group 4 becomes extremely large. Therefore, particularly if the buffer layer is formed thin, the buffer effect can not be exhibited, so that the crystallinity and the surface morphology of the semiconductor layer group can not be sufficiently improved.

In this case, it is desired that the material composition of the first semiconductor nitride is varied continuously or stepwisely in the thickness direction. Concretely, in the above case, the Al content of the first semiconductor nitride is decreased continuously or stepwisely from the substrate I toward the buffer layer 3, and, on the contrary, the Ga content of the first semiconductor nitride is increased continuously or stepwisely from the substrate 1 toward the buffer layer 3.

It is required that the third semiconductor nitride constituting the semiconductor layer group 4 includes Ga element, that is, being composed of a GaN-based semiconductor. Although the third semiconductor nitride may include Al, In or another additive element as well as the first semiconductor nitride, it is preferably composed of GaN. That is, the operation and effect of the present invention can be exhibited more effectively if the semiconductor layer group 4 is made of GaN.

As mentioned above, the semiconductor layer group 4 may be composed of a single semiconductor layer such as a conductive p-type GaN layer or a conductive n-type GaN layer as well as a non-conductive GaN layer, or a multilayered structure made of plural semiconductor layers such as Al or In-including semiconductor layers.

In this embodiment as shown in FIG. 1, the crystallinity of the semiconductor layer group 4 can be enhanced up to 200 seconds or below, particularly 150 seconds or below in FWHM of X-ray rocking curve. Particularly, in the case of employing the sapphire single crystal substrate having the surface nitride layer, the crystallinity of the semiconductor group 4 can be easily enhanced up 150 seconds or below.

Herein, the FWHM of the semiconductor layer group 4 is measured in the X-ray rocking curve at (002) reflection.

The buffer layer 3 and the semiconductor layer group 4 may be formed by a MOCVD method as well as the underlayer 2.

Therefore, the semiconductor element 10 may be fabricated in the same apparatus at the same batch. However, the underlayer 2 and the semiconductor layer group 4 may be fabricated at their respective different batches. In this case, the underlayer 2 is exposed to atmosphere before the semiconductor layer group 4 is fabricated, so that a thin oxide film may be created on the underlayer 2.

In this case, the buffer layer 3 serves as a cap layer for the underlayer 2, so that the semiconductor layer group 4 is not greatly affected from the oxide film. As a result, the degradation in crystallinity of the semiconductor layer group 4 can be inhibited. In this case, to oxidized portion of the buffer layer 3 is etched. Moreover, although the buffer layer 3 may be etched entirely, thereafter, another buffer layer must be formed.

EXAMPLES

This invention will be concretely described, hereinafter

Example

A substrate made of c-faced sapphire single crystal was employed, and attracted and set onto a susceptor installed in a reactor. Then, the substrate was heated to 1150° C. with flowing a $H_2$ carrier gas.

Thereafter, an $NH_3$ gas was flown with a $H_2$ carrier gas for five minutes, to nitride the main surface of the substrate. In ESCA analysis, it was turned out that a surface nitride layer was formed on the main surface by the surface-nitriding treatment, and the nitrogen content at the depth of 1 nm from the main surface was seven atomic percentages.

Then, a TMA gas and an $NH_3$ gas were employed as an Al raw material gas and a $N_2$ raw material gas, respectively, and introduced into the reactor and supplied onto the substrate at a flow rate ratio of $(TMA/NH_3)=450$ under a pressure of 15 Torr, to form an AlN film in a thickness of 1 μm as an underlayer on the substrate.

The crystallinity of the AlN underlayer was 90 seconds or below in FWHN of X-ray rocking curve, and thus, the good crystallinity of the AlN underlayer was confirmed. Moreover the surface roughness Ra of the AlN underlayer is 2 Å, and thus, the good surface flatness of the AlN film was confirmed.

Thereafter, the substrate was cooled down to 600° C., and a TMG gas was introduced into the reactor and supplied onto the AlN underlayer with the TMA gas and the $NH_3$ gas at a flow rate ratio of $(TMA+TMG/NH_3)=3000$ under an atmospheric pressure, to form a GaN film in a thickness of 0.02 μm as a buffer layer.

Then, the substrate was heated to 1050° C., a TMG gas and an ammonia gas were supplied on the GaN buffer layer at a flow rate ratio of $(TMG/NH_3)=3000$, to form a GaN semiconductor layer in a thickness of 2 μm.

The crystallinity of the GaN semiconductor layer was 150 seconds or below in FWHM of X-ray rocking curve, and thus, the good crystallinity of the GaN semiconductor layer was confirmed. Therefore, the thus obtained semiconductor element is preferably usable as a GaN-based blue light-emitting element.

Comparative Example

Except that the AlN underlayer is not formed, a semiconductor element was fabricated in the same manner as the above-discussed Example. In this case, since the semiconductor element does not include the AlN underlayer, the crystallinity of the GaN semiconductor layer was only 300 seconds in FWHM of X-ray rocking curve, which is much more inferior to that of the GaN semiconductor layer in the Example.

Although the present invention was described in detail with reference to the above examples, this invention is not limited to the above disclosure and every kind of variation and modification may be made without departing from the scope of the present invention. For example, for more enhancing of the crystallinity of the semiconductor layer group, a multilayered structure such as a distorted superlattice structure may be inserted into the semiconductor layer group or between the semiconductor layer group and the buffer layer.

As mentioned above, according to the present invention, a semiconductor element, usable as a blue light-emitting element or the like and including a high crystallinity GaN-based semiconductor layer group, can be easily provided.

What is claimed is:

1. A semiconductor element, comprising:
    a substrate;
    an underlayer on the substrate comprising a first semiconductor nitride including at least Al, the crystallinity of the underlayer being set to have a full width at half maximum X-ray rocking curve value of 90 seconds or below;
    a buffer layer on the underlayer comprising a second semiconductor nitride; and
    a semiconductor layer group on the buffer layer comprising a third semiconductor nitride including at least Ga, and being independent from the buffer layer and the underlayer, wherein
    an Al content of the third semiconductor nitride is set smaller than that of the first semiconductor nitride, the thickness of the underlayer is set within 0.5–1000 μm and the thickness of the buffer layer is set within 0.002–0.1 μm.

2. A semiconductor element as defined in claim 1, wherein the Ga content of the second semiconductor nitride is set to be not more than that of the third semiconductor nitride.

3. A semiconductor element as defined in claim 1, wherein the Al content of the first semiconductor nitride is at least 50 atomic percentage of all of the III elements present in the first semiconductor nitride.

4. A semiconductor element as defined in claim 3, wherein the first semiconductor nitride is AlN.

5. A semiconductor element as defined in claim 1, wherein the underlayer is formed at a temperature of at least 1100° C. by a MOCVD method.

6. A semiconductor element as defined in claim 5, wherein the underlayer is formed within 1100–1250° C.

7. A semiconductor element as defined in claim 1, wherein the substrate is made of sapphire single crystal, and the underlayer is formed on the main surface of the substrate via a surface nitride layer formed at the main surface.

8. A semiconductor element as defined in claim 1, wherein the Al content of the first semiconductor nitride is decreased continuously or stepwisely from the substrate toward the buffer layer.

9. A semiconductor element as defined in claim 1, wherein the semiconductor layer group includes a GaN semiconductor layer.

10. A semiconductor element as defined in claim 1, wherein the full width at half maximum X-ray rocking curve value of the semiconductor layer group is set to 150 seconds or below.

11. A photonic device comprising a semiconductor element as defined in claim 1.

12. A semiconductor element as defined in claim 1, wherein the thickness of the buffer layer is smaller than the thickness of the underlayer and the thickness of the semiconductor layer group.

13. A semiconductor element as defined in claim 1, wherein the thickness of the underlayer is greater than 0.5 μm and equal to or less than 1000 μm.

* * * * *

UNITED STATES PATENT AND TRADEMARK OFFICE
CERTIFICATE OF CORRECTION

PATENT NO. : 7,067,847 B2
APPLICATION NO. : 10/017325
DATED : June 27, 2006
INVENTOR(S) : Tomohiko Shibata et al.

It is certified that error appears in the above-identified patent and that said Letters Patent is hereby corrected as shown below:

<u>Title Page</u>

Item (73) Assignee:

Please change "NGK Isulators, Ltd." to --NGK Insulators, Ltd.--

Signed and Sealed this

Seventh Day of November, 2006

JON W. DUDAS
*Director of the United States Patent and Trademark Office*